US012588396B2

(12) United States Patent
Fang et al.

(10) Patent No.: US 12,588,396 B2
(45) Date of Patent: Mar. 24, 2026

(54) ARRAY SUBSTRATE AND DISPLAY PANEL COMPRISING LIGHT ADJUSTING LAYER BETWEEN TRANSPARENT LAYERS

(71) Applicant: KunShan Go-Visionox Opto-Electronics Co., Ltd, Jiangsu (CN)

(72) Inventors: Xuyang Fang, Kunshan (CN); Chao Chi Peng, Kunshan (CN); Mingxing Liu, Kunshan (CN); Zihao Wang, Kunshan (CN); Panpan Wang, Kunshan (CN); Zhiyuan Zhang, Kunshan (CN); Shuaiyan Gan, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 590 days.

(21) Appl. No.: 17/733,298

(22) Filed: Apr. 29, 2022

(65) Prior Publication Data

US 2022/0255046 A1 Aug. 11, 2022

Related U.S. Application Data

(63) Continuation of application No. PCT/CN2021/082966, filed on Mar. 25, 2021.

(30) Foreign Application Priority Data

May 22, 2020 (CN) .......................... 202010443122.3

(51) Int. Cl.
| | |
|---|---|
| *H10K 59/80* | (2023.01) |
| *H10K 59/65* | (2023.01) |
| *H10K 102/10* | (2023.01) |

(52) U.S. Cl.
CPC ........... *H10K 59/879* (2023.02); *H10K 59/87* (2023.02); *H10K 59/65* (2023.02); *H10K 2102/101* (2023.02)

(58) Field of Classification Search
None
See application file for complete search history.

(56) References Cited

U.S. PATENT DOCUMENTS

| | | | |
|---|---|---|---|
| 2004/0095535 A1 | 5/2004 | Nakagawa | |
| 2018/0151843 A1* | 5/2018 | Ma | H10K 50/816 |
| 2020/0243801 A1* | 7/2020 | Xu | H10K 59/131 |

FOREIGN PATENT DOCUMENTS

| | | |
|---|---|---|
| CN | 104156097 A | 11/2014 |
| CN | 104950510 | 9/2015 |

(Continued)

OTHER PUBLICATIONS

International Search Report mailed Jun. 29, 2021, in corresponding to International Application No. PCT/CN2021/082966; 5 pages (with English Translation).

(Continued)

*Primary Examiner* — Daniel Whalen
(74) *Attorney, Agent, or Firm* — Maier & Maier, PLLC

(57) ABSTRACT

An array substrate and a display panel, which relate to the technical field of flexible displays and are used for solving the problem of the Newton's ring phenomenon due to unequal spacing between transparent layers affects the display effect of the display panel. The array substrate or a display panel include at least two transparent layers stacked in sequence, and a light adjusting layer arranged between at least two adjacent transparent layers, where a product of a refractive index of the light adjusting layer and a thickness of the light adjusting layer is greater than one half of a preset wave train length.

11 Claims, 10 Drawing Sheets

(56)          References Cited

FOREIGN PATENT DOCUMENTS

| CN | 102956712 | B | 12/2016 |
| CN | 109473452 | A | 3/2019 |
| CN | 109891278 | A | 6/2019 |
| CN | 110323354 | A | 10/2019 |
| CN | 110649176 | A | 1/2020 |
| CN | 111477674 | A | 7/2020 |

OTHER PUBLICATIONS

Notification to Grant Patent dated Jul. 27, 2022, in corresponding to Chinese Application No. 202010443122.3; 6 pages (with English Translation).

* cited by examiner

ARRAY SUBSTRATE AND DISPLAY PANEL COMPRISING LIGHT ADJUSTING LAYER BETWEEN TRANSPARENT LAYERS

CROSS-REFERENCE TO RELATED APPLICATION

The present application is a continuation of International Application No. PCT/CN2021/082966, filed on Mar. 25, 2021, which claims priority to the Chinese Patent Application No. 202010443122.3, filed before China National Intellectual Property Administration on May 22, 2020, entitled "ARRAY SUBSTRATE, DISPLAY PANEL AND DISPLAY APPARATUS", both of which are hereby incorporated by reference in their entireties.

TECHNICAL FIELD

The present application relates to the technical field of flexible display, and in particular, to an array substrate and a display panel.

BACKGROUND

An organic light-emitting diode (OLED) display panel has been widely applied to the display field due to its characteristics such as self-illumination, high contrast ratio, thin thickness, fast response, wide viewing angle, low power consumption and capability of realizing flexible display.

A display panel includes a plurality of transparent layers stacked alternately, and at least some of the transparent layers are provided with blind holes. Photosensitive elements such as cameras are buried under the display panels corresponding to the blind holes, and external light may enter the photosensitive elements located under the display panels through the blind holes, and thus images are obtained.

However, the transparent layers covering the blind holes are prone to collapse into the blind holes, which leads to a Newton's ring phenomenon on the display panel and affects the display of the display panel.

SUMMARY

In view of the above problem, embodiments of the present application provide an array substrate and a display panel, which are used for eliminating the Newton's ring phenomenon and improving the display effect of the display panel.

In order to achieve the above purposes, the embodiments of the present application provide the following technical solutions:

A first aspect of an embodiment of the present application provides an array substrate, including: at least two transparent layers stacked in sequence. A light adjusting layer is arranged between at least adjacent two of the transparent layers, and a product of a refractive index of the light adjusting layer and a thickness of the light adjusting layer is greater than one half of a preset wave train length.

A second aspect of an embodiment of the present application provides a display panel, including: the array substrate provided in the first aspect above, a light-emitting layer disposed on the array substrate, and an encapsulation layer disposed on the light-emitting layer. A light adjusting layer is arranged between the light-emitting layer and the encapsulation layer, and at least one side of the light adjusting layer located between the light-emitting layer and the encapsulation layer is attached to the encapsulation layer and the light-emitting layer.

A third aspect of an embodiment of the present application provides a display panel, including: an array substrate, a light-emitting layer disposed on the array substrate, and an encapsulation layer disposed on the light-emitting layer, where the light adjusting layer is arranged between the light-emitting layer and the encapsulation layer, and at least one side of the light adjusting layer located between the light-emitting layer and the encapsulation layer is attached to the encapsulation layer or the light-emitting layer.

The array substrate, the display panel and the display apparatus provided by the embodiments of the present application have the following advantages:

In the array substrate provided by the embodiments of the present application, the light adjusting layer is arranged between at least two adjacent transparent layers, and a product of the refractive index of the light adjusting layer and the thickness of the light adjusting layer is greater than one half of the preset wave train length. In this way, a preset-wavelength light has an increased optical path difference between adjacent two transparent layers, and the formation condition of Newton's ring is destroyed, and thus the Newton's ring phenomenon is eliminated and the display effect of the display panel is improved.

In addition to the technical problem solved by the embodiments of the present application, the technical features constituting the technical solutions and the beneficial effects brought though the technical features of these technical solutions described above, other technical problems that can be solved though the array substrate, the display panel and the display apparatus provided by the embodiments of the present application, other technical features contained in the technical solutions and the beneficial effects brought though these technical features will be further explained in detail in certain embodiments.

DESCRIPTION OF EMBODIMENTS

Figure 1:
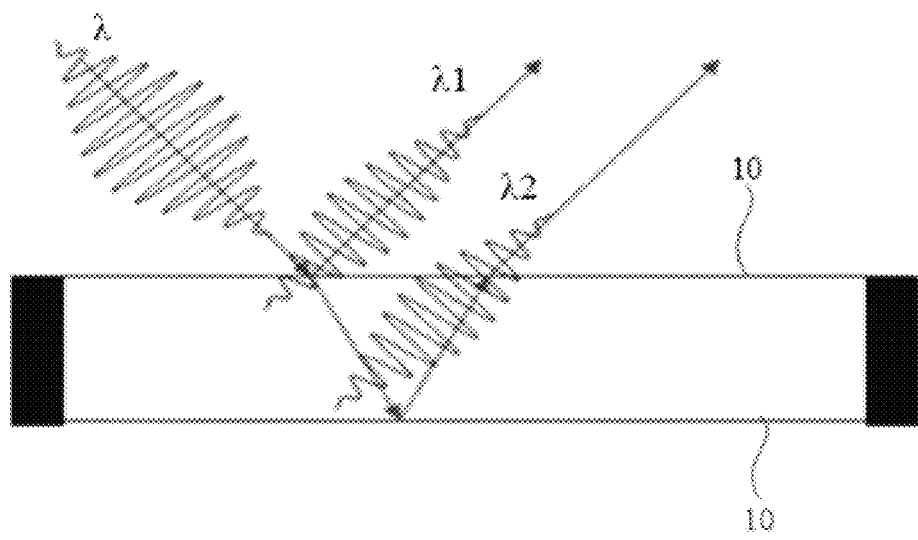
FIG. 1 is a light interference model with a Newton's ring phenomenon in an array substrate.

A main reason for Newton's ring generated on a display panel is that an atmospheric pressure difference inside and outside a blind hole causes a transparent layer above the blind hole to collapse toward the inside of the blind hole, which in turn causes an non-uniform distance between transparent layers on both sides of the blind hole, and when incident light with wavelength $\lambda$ is incident from a transparent layer located on an upper layer, the incident light with wavelength $\lambda$ has unequal optical path differences between the transparent layers on both sides of the blind hole, and as shown in FIG. 1, when an optical path difference of the incident light with wavelength $\lambda$, between the transparent layers on both sides of the blind hole is less than the wavelength $\lambda$, the incident light with wavelength $\lambda$ will be reflected on the transparent layers on both sides of the blind hole almost simultaneously, forming reflected light $\lambda 1$ and reflected light $\lambda 2$, and light interference occurs between the reflected light $\lambda 1$ and the reflected light $\lambda 2$, which leads to a Newton's ring phenomenon and affects the display of a display panel.

Figure 2:
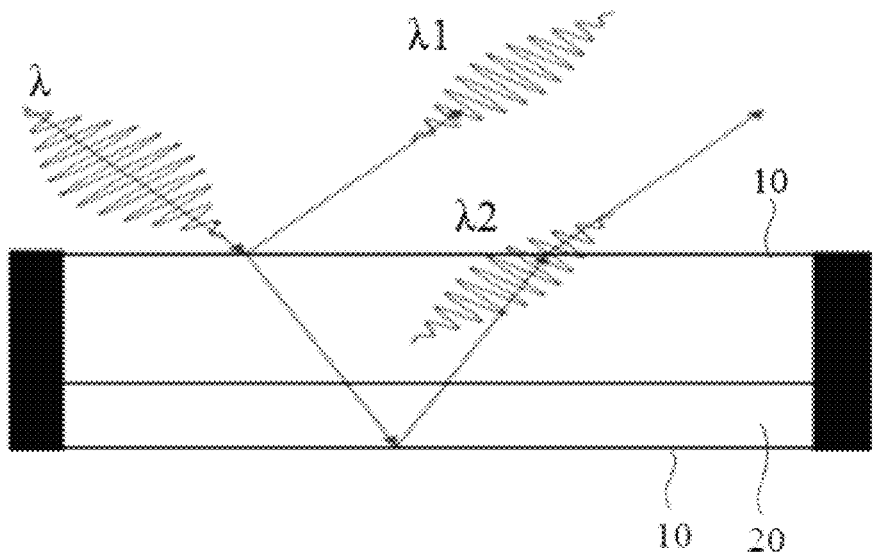
FIG. 2 is a light non-interference model without a Newton's ring phenomenon in an array substrate according to an embodiment of the present application.

In order to solve the above problem, in an array substrate, a display panel and a display apparatus provided by an embodiment of the present application, a light adjusting layer is arranged between at least two adjacent transparent layers, and a product of a refractive index of the light adjusting layer and a thickness of the light adjusting layer is greater than one half of a preset wave train length, and for example, as shown in FIG. 2, when incident light with a wavelength of $\lambda$ is incident from a transparent layer 10 on an upper layer, a light adjusting layer increases an optical path difference of the incident light with the wavelength of $\lambda$ between adjacent two transparent layers, and the optical path difference is larger than the wavelength of the incident light with the wavelength of $\lambda$. Therefore, when the incident light with the wavelength of $\lambda$ is incident from the transparent layer 10 on the upper layer, a reflected light $\lambda 1$ formed on the transparent layer above the light adjusting layer is first reflected, and a reflected light $\lambda 2$ formed on the transparent layer below the light adjusting layer is then reflected. In this way, the interference between the reflected light $\lambda 1$ and the reflected light $\lambda 2$ is avoided, and a formation condition of Newton's ring is destroyed, and thus the Newton's ring phenomenon is eliminated and the display effect of the display panel is improved.

In order to make the purposes, features and advantages of embodiments of the present application more apparent and comprehensible, the technical solutions of the embodiments of the present application will be clearly and completely described below with reference to the drawings of the embodiments of the present application. Obviously, the described embodiments are part of embodiments of the present application, rather than all of the embodiments. Based on the embodiments in the present application, all other embodiments obtained by those of ordinary skill in the art without paying creative effort shall fall within the protection scope of the present application.

Figure 3:
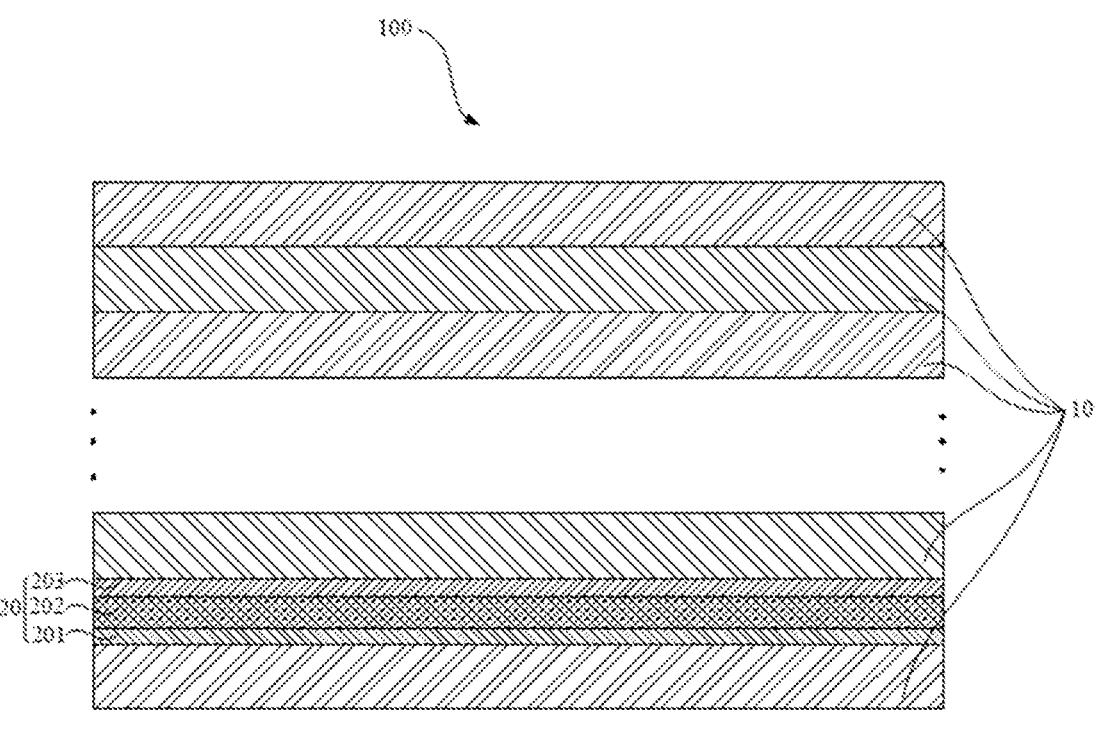
FIG. 3 is a schematic structural diagram of an array substrate according to an embodiment of the present application.
Figure 3:

Referring to FIG. 3, an array substrate 100 provided by an embodiment of the present application includes at least two transparent layers 10 stacked in sequence, and a light adjusting layer 20 is provided between at least two adjacent transparent layers 10, and a product of a refractive index of the light adjusting layer 20 and a thickness of the light adjusting layer 20 is greater than one half of a preset wave train length.

When a preset-wavelength light is incident into the array substrate 100, a condition of mutual interference of the preset-wavelength light between adjacent two transparent layers is as follows:

$$2nd \ll L_\lambda$$

Where n is a refractive index of a dielectric layer between adjacent two transparent layers 10, and d is a thickness of the dielectric layer between the adjacent two transparent layers 10, $L_\lambda$ is the preset wave train length.

The Newton's ring phenomenon occurs when the preset-wavelength light between adjacent two transparent layers 10 meets the above condition of mutual interference. In this embodiment, the light adjusting layer 20 is arranged between at least two adjacent transparent layers 10, and the product of the refractive index of the light adjusting layer 20 and the thickness of the light adjusting layer 20 is greater than one half of the preset wave train length. In this way, the optical path difference of the preset-wavelength light between the adjacent two transparent layers 10 is increased, and the condition of mutual interference of light between the adjacent two transparent layers 10 is destroyed, that is, the formation condition of Newton's ring is destroyed, and thus the Newton's ring phenomenon is eliminated.

The material of the light adjusting layer 20 may be selected from high refractive index materials, such as titanium dioxide and zinc oxide. At the same time, the thickness of the light adjusting layer 20 may be adjusted according to the refractive index of the light adjusting layer 20, and the thickness of the light adjusting layer 20 needs to meet the requirements of the overall thickness of the array substrate 100; or the refractive index of the light adjusting layer 20 may be selected according to an allowable thickness of the light adjusting layer 20, so that the product of the refractive index of the light adjusting layer 20 and the thickness of the light adjusting layer 20 is greater than one half of the preset wave train length.

In this embodiment, the light adjusting layer 20 includes a first light modulation layer 201, an optical path adjustment layer 202, and a second light modulation layer 203 stacked in sequence. Two sides of the optical path adjustment layer 202 are respectively attached to the first light modulation layer 201 and the second light modulation layer 203. A refractive index of the first light modulation layer 201 is between a refractive index of the transparent layer 10 adjacent to the first light modulation layer 201 and a refractive index of the optical path adjustment layer 202; a refractive index of the second light modulation layer 203 is between the refractive index of the transparent layer 10 adjacent to the second light modulation layer 203 and the refractive index of the optical path adjustment layer 202. In this way, by arranging the first light modulation layer 201 and the second light modulation layer 203, the transmittance of the preset-wavelength light in the optical path adjustment layer 202 may be improved, and the reflection intensity of the preset-wavelength light in the optical path adjustment layer 202 may be reduced, thereby reducing the reflectivity of the optical path adjustment layer 202 and avoiding the Newton's ring phenomenon caused by the large reflectivity of the optical path adjustment layer 202. In addition, since the product of the refractive index of the optical path adjustment layer 202 and the thickness of the optical path adjustment layer 202 is greater than one half of the preset wave train length, and thus the formation condition of Newton's ring is destroyed, thereby the Newton's ring phenomenon is eliminated.

The materials of the first light modulation layer 201 and the second light modulation layer 203 may include lithium fluoride layer, magnesium fluoride, silicon oxide, doped quartz film or silicon oxide/silicon composite layer, and the like. The first light modulation layer 201 and the second light modulation layer 203 are formed by evaporation, sputtering, electron beam evaporation, coating, chemical vapor deposition (CVD) and the like. The material of the optical path adjustment layer 202 may include titanium dioxide, zinc oxide or other high refractive index materials, and the optical path adjustment layer 202 may be formed by attaching, sputtering, electron beam evaporation, CVD, evaporation or other methods.

Specifically, the transparent layer 10 in the array substrate 100 may be of two layers or multiple layers. When there are two transparent layers 10 in the array substrate, the light adjusting layer 20 is arranged between the two transparent layers 10; when there are multiple transparent layers 10 in the array substrate 100, a light adjusting layer 20 may be arranged between adjacent two transparent layers 10, or light adjusting layers 20 may be arranged between all adjacent transparent layers 10, as long as the Newton's ring phenomenon can be eliminated.

Figure 4:
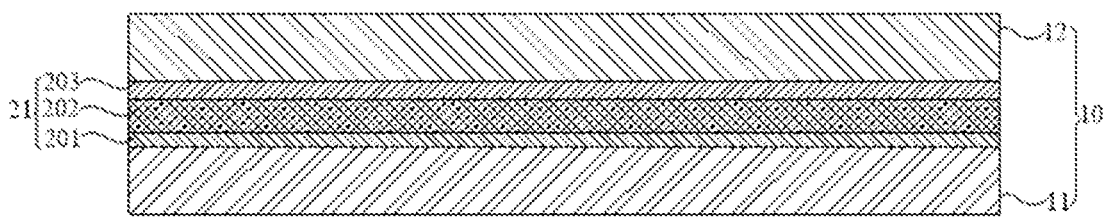
FIG. 4 is a schematic structural diagram of an array substrate in which a light adjusting layer is arranged between a substrate and a buffer layer according to an embodiment of the present application.

For at least two transparent layers 10, one transparent layer 10 may be a substrate 11, and the other transparent layer 10 adjacent to the substrate 11 may be a buffer layer 12. As shown in FIG. 4, the formation condition of Newton's ring is destroyed and the Newton's ring phenomenon is eliminated by arranging the light adjusting layer 20 between the substrate 11 and the buffer layer 12. For the convenience of description and understanding, in this embodiment, the light adjusting layer 20 arranged between the substrate 11 and the buffer layer 12 is replaced by a first light adjusting layer 21.

Since a gap will be formed between the substrate 11 and the buffer layer 12 due to errors in manufacturing, installation and the like, or an mounting hole for a camera and other equipment needs to be set, the substrate 11 is easy to collapse toward a side of the buffer layer 12 under an atmospheric pressure, which results in an non-uniform distance between the substrate 11 and the buffer layer 12. When preset-wavelength light is incident on the substrate 11 and the buffer layer 12, the optical path differences of the preset-wavelength light between the substrate 11 and the buffer layer 12 are unequal, and the optical path difference is locally too small, which leads to small reflection time difference on the substrate 11 and the buffer layer 12 for the preset-wavelength light incident between the substrate 11 and the buffer layer 12 and thus leads to the mutual interference between the reflected light of the preset-wavelength light on the substrate 11 and the reflected light of the preset-wavelength light on the buffer layer 12, and thus the Newton's ring phenomenon occurs.

Therefore, in this embodiment, the first light adjusting layer 21 is arranged between the substrate 11 and the buffer layer 12, and two sides of the first light adjusting layer 21 between the substrate 11 and the buffer layer 12 are respectively attached to the substrate 11 and the buffer layer 12, where the product of the refractive index of the first light adjusting layer 21 and the thickness of the first light adjusting layer 21 is greater than one half of the preset wave train length. In this way, the optical path difference of the preset-wavelength light between the substrate 11 and the buffer layer 12 is increased, the reflection time of the preset-wavelength light on the substrate 11 is delayed, and the mutual interference between the reflected light of the preset-wavelength light on the buffer layer 12 and the reflected light of the preset-wavelength light on the substrate 11 is avoided. That is, the condition under which the preset-wavelength light interferes between the substrate 11 and the buffer layer 12 is destroyed, the formation condition of Newton's ring is destroyed, and thus the Newton's ring phenomenon is avoided.

Furthermore, in order to avoid the Newton's ring phenomenon caused by high reflectivity of the first light adjusting layer 21, in this embodiment, the first light adjusting layer 21 further includes a first light modulation layer 201, an optical path adjustment layer 202 and a second light modulation layer 203 stacked in sequence, and two sides of the optical path adjustment layer 202 are respectively attached to the first light modulation layer 201 and the second light modulation layer 203, where the first light modulation layer 201 is attached to the substrate 11, the second light modulation layer 203 is attached to the buffer layer 12, and the refractive index of the first light modulation layer 201 is between the refractive index of the substrate 11 and the refractive index of the optical path adjustment layer 202; the refractive index of the second light modulation layer 203 is between the refractive index of the buffer layer 12 and the refractive index of the optical path adjustment layer 202; the product of the refractive index of the optical path adjustment layer 202 and the thickness of the optical path adjustment layer 202 is greater than one half of the preset wave train length. In this embodiment, firstly the reflectivity of the preset-wavelength light in the optical path adjustment layer 202 is reduced by arranging the first light modulation layer 201 and the second light modulation layer 203, and then the formation condition of Newton's ring is destroyed though the optical path adjustment layer 202, and thus the Newton's ring phenomenon between the substrate 11 and the buffer layer 12 is eliminated.

The substrate 11 may be a transparent substrate 11 made of polyimide (PI), polyethylene terephthalate (PET), glass or other materials.

Figure 5:
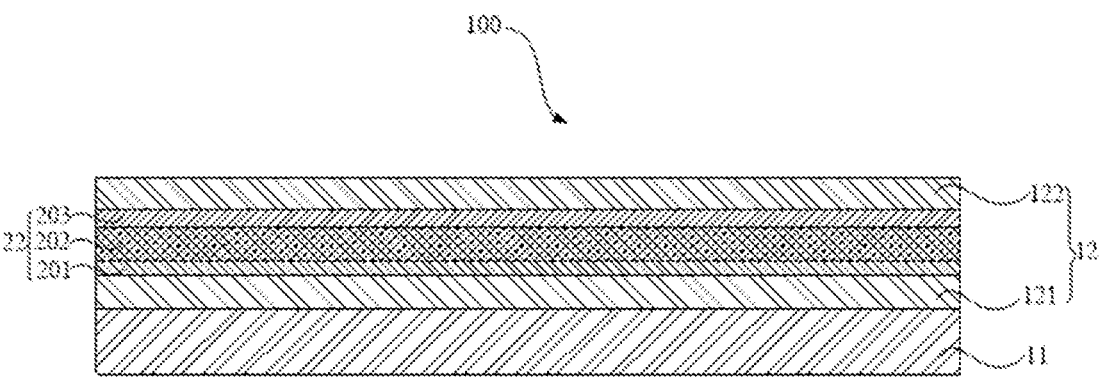
FIG. 5 is a schematic structural diagram of an array substrate in which a light adjusting layer is arranged between a first buffer layer and a second buffer layer according to an embodiment of the present application.
Figure 6:
FIG. 6 is a schematic structural diagram of an array substrate in which light adjustment layers are arranged between a substrate and a first buffer layer, and between the first buffer layer and a second buffer layer according to an embodiment of the present application.
Figure 6:
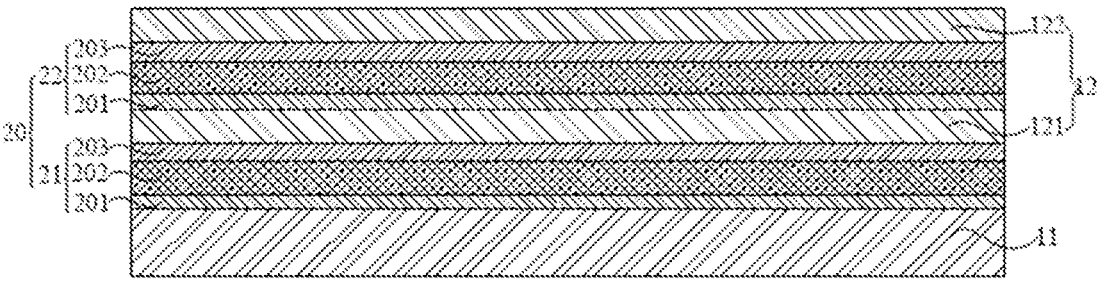

On the basis of the above embodiment, as shown in FIGS. 5 and 6, the buffer layer 12 includes a first buffer layer 121 close to the substrate 11 and a second buffer layer 122 parallel to and opposite to the first buffer layer 121; a light adjusting layer 20 is arranged between the first buffer layer 121 and the second buffer layer 122, and two sides of the light adjusting layer 20 located between the first buffer layer 121 and the second buffer layer 122 are respectively attached to the first buffer layer 121 and the second buffer layer 122.

For the convenience of description and understanding, in this embodiment, the light adjusting layer 20 arranged between the first buffer layer 121 and the second buffer layer 122 is replaced by a second light adjusting layer 22.

The condition of forming Newton's ring between the first buffer layer 121 and the second buffer layer 122 may be destroyed by arranging the second light adjusting layer 22 between the first buffer layer 121 and the second buffer layer 122, and thus the Newton's ring phenomenon between the first buffer layer 121 and the second buffer layer 122 is eliminated.

Specifically, the second light adjusting layer 22 includes a first light modulation layer 201, an optical path adjustment layer 202 and a second light modulation layer 203 stacked in sequence, and two sides of the optical path adjustment layer 202 are respectively attached to the first light modulation layer 201 and the second light modulation layer 203. In this embodiment, the first light modulation layer 201 is attached to the first buffer layer 121, the second light modulation layer 203 is attached to the second buffer layer 122, and the refractive index of the first light modulation layer 201 is between the refractive index of the first buffer layer 121 and the refractive index of the optical path adjustment layer 202; the refractive index of the second light modulation layer 203 is between the refractive index of the second buffer layer 122 and the refractive index of the optical path adjustment layer 202; the product of the refractive index of the optical path adjustment layer 202 and the thickness of the optical path adjustment layer 202 is greater than one half of the preset wave train length. Therefore, in this embodiment, firstly, the reflectivity of the optical path adjustment layer 202 is reduced though the first light modulation layer 201 and the second light modulation layer 203, and then the formation condition of Newton's ring is destroyed though the optical path adjustment layer 202, and thus the Newton's ring phenomenon between the first buffer layer 121 and the second buffer layer 122 is eliminated.

It should be noted that the first light adjustment layer 21 and the second light adjustment layer 22 may exist simultaneously or independently.

Figure 7:
FIG. 7 is a schematic structural diagram of an array substrate in which light adjustment layers are arranged between a substrate and a buffer layer, and between the buffer layer and a circuit layer according to an embodiment of the present application.
Figure 7:
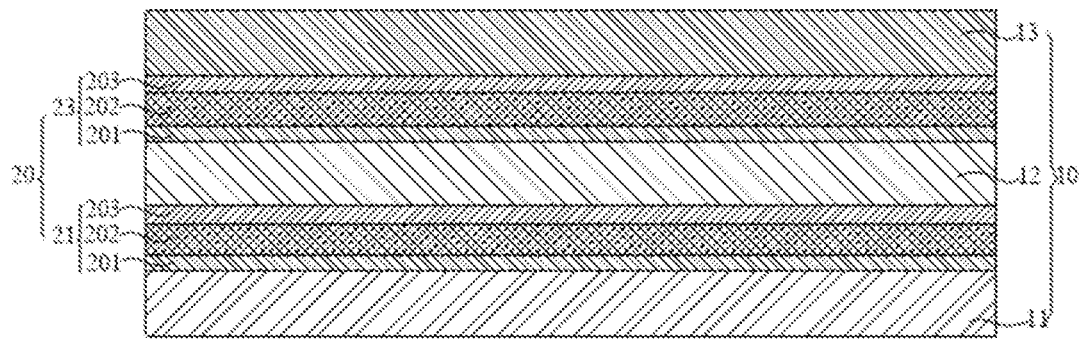

In an optional embodiment, as shown in FIG. 7, at least two transparent layers 10 further include a circuit layer 13 arranged on the buffer layer 12; a light adjusting layer 20 is arranged between the buffer layer 12 and the circuit layer 13, and two sides of the light adjusting layer 20 between the buffer layer 12 and the circuit layer 13 are respectively attached to the buffer layer 12 and the circuit layer 13.

For convenience of description and understanding, in this embodiment, the light adjusting layer 20 arranged between the buffer layer 12 and the array circuit layer 13 is replaced by a third light adjusting layer 23.

In this embodiment, by arranging the third light adjusting layer 23 between the buffer layer 12 and the circuit layer 13, the condition of forming Newton's ring between the buffer layer 12 and the circuit layer 13 is destroyed, and thus the Newton's ring phenomenon between the buffer layer 12 and the circuit layer 13 is eliminated.

Specifically, the third light adjusting layer 23 includes a first light modulation layer 201, an optical path adjustment layer 202 and a second light modulation layer 203 stacked in sequence, and two sides of the optical path adjustment layer 202 are respectively attached to the first light modulation layer 201 and the second light modulation layer 203. In this embodiment, the first light modulation layer 201 is attached to the buffer layer 12, the second light modulation layer 203 is attached to the circuit layer 13, and the refractive index of the first light modulation layer 201 is between the refractive index of the buffer layer 12 and the refractive index of the optical path adjustment layer 202; the refractive index of the second light modulation layer 203 is between the refractive index of the circuit layer 13 and the refractive index of the optical path adjustment layer 202; the product of the refractive index of the optical path adjustment layer 202 and the thickness of the optical path adjustment layer 202 is greater than one half of the preset wave train length. Therefore, in this embodiment, firstly, the reflectivity of the preset-wavelength light in the optical path adjustment layer 202 is reduced by the first light modulation layer 201 and the second light modulation layer 203, and then the formation condition of Newton's ring is destroyed though the optical path adjustment layer 202, and thus the Newton's ring phenomenon between the buffer layer 12 and the circuit layer 13 is eliminated.

Figure 8:
FIG. 8 is a schematic structural diagram of an array substrate in which a light adjusting layer is arranged between a substrate and a circuit layer according to an embodiment of the present application.
Figure 8:
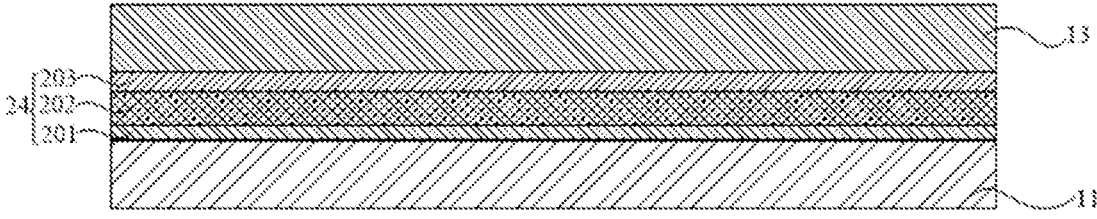

Optionally, as shown in FIG. 8, for at least two transparent layers 10, one transparent layer 10 is a substrate 11, and the other transparent layer 10 adjacent to the substrate 11 is a circuit layer 13; a light adjusting layer 20 is arranged between the substrate 11 and the circuit layer 13, and two sides of the light adjusting layer 20 between the substrate 11 and the circuit layer 13 are respectively attached to the substrate 11 and the circuit layer 13.

For convenience of description and understanding, in this embodiment, the light adjusting layer 20 arranged between the substrate 11 and the circuit layer 13 is replaced by a fourth light adjusting layer 24.

In this embodiment, the condition of forming Newton's ring between the substrate 11 and the circuit layer 13 may be destroyed though arranging the fourth light adjusting layer 24 between the substrate 11 and the circuit layer 13, and thus the Newton's ring phenomenon between the substrate 11 and the circuit layer 13 is eliminated.

Specifically, the fourth light adjusting layer 24 includes a first light modulation layer 201, an optical path adjustment layer 202 and a second light modulation layer 203 stacked in sequence, and two sides of the optical path adjustment layer 202 are respectively attached to the first light modulation layer 201 and the second light modulation layer 203. In this embodiment, the first light modulation layer 201 is attached to the substrate 11, the second light modulation layer 203 is attached to the circuit layer 13, and the refractive index of the first light modulation layer 201 is between the refractive index of the substrate 11 and the refractive index of the optical path adjustment layer 202; the refractive index of the second light modulation layer 203 is between the refractive index of the circuit layer 13 and the refractive index of the optical path adjustment layer 202; the product of the refractive index of the optical path adjustment layer 202 and the thickness of the optical path adjustment layer 202 is greater than one half of the preset wave train length. Therefore, in this embodiment, firstly, the reflectivity of the preset-wavelength light in the optical path adjustment layer 202 is reduced though the first light modulation layer 201 and the second light modulation layer 203, and then the formation condition of Newton's ring is destroyed though the optical path adjustment layer 202, and thus the Newton's ring phenomenon between the substrate 11 and the circuit layer 13 is eliminated.

Optionally, the circuit layer 13 includes a plurality of insulation layers and a plurality of conductive layers stacked alternately, and a light adjusting layer 20 may be arranged between adjacent conductive layers and insulation layers to eliminate the Newton's ring phenomenon between adjacent conductive layers and insulation layers.

Generally, the plurality of conductive layers include a gate layer, a metal layer and an anode layer, and the plurality of insulation layers include a gate insulation layer between the gate layer and the substrate 11, and an interlayer insulation layer between the gate layer and the metal layer, between adjacent metal layers or between the metal layer and the anode layer. For example, the conductive layer near the substrate 11 is the gate layer, and the insulation layer between the gate layer and the substrate 11 is the gate insulation layer.

Optionally, in the above embodiment, the material of the optical path adjustment layer 202 in the light adjusting layer 20 may be a material with high refractive index such as titanium dioxide layer or zinc oxide layer.

Figure 9:
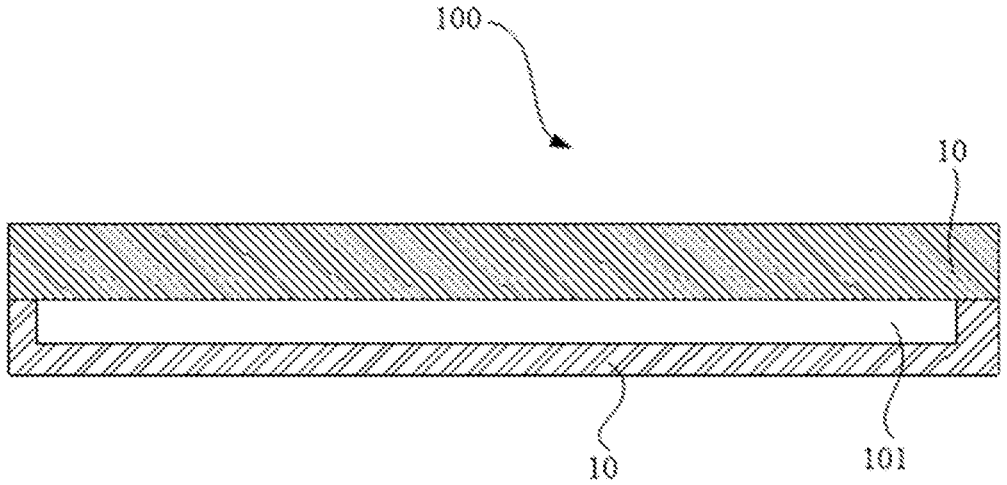
FIG. 9 is a schematic structural diagram of an array substrate in which one transparent layer is provided with a groove on a side facing an adjacent transparent layer according to another embodiment of the present application.

As shown in FIG. 9, in this embodiment, for adjacent two transparent layers 10, at least a side of one transparent layer 10 close to the other transparent layer 10 is provided with a groove 101, so as to form an air layer between the adjacent two transparent layers 10, with the air layer being a light adjusting layer 20. In this embodiment, the transparent layer 10 located at the lower layer is provided with a groove 101, the side wall of the groove 101 extends along the circumferential edge of the transparent layer 10, the top of the groove 101 is in contact with the transparent layer 10 located at the upper layer, and an air layer is formed in the gap formed by the side wall of the groove 101 and adjacent two transparent layers 10, the air layer is the light adjusting layer 20.

Figure 10:
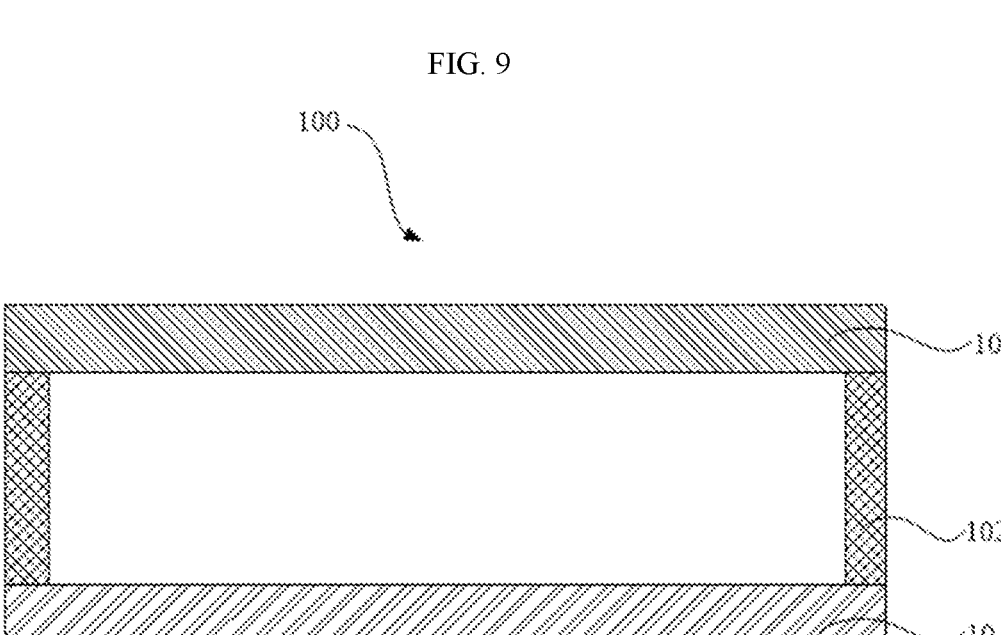
FIG. 10 is a schematic structural diagram of a convex pad between adjacent two transparent layers in an array substrate according to another embodiment of the present application.

Referring to FIG. 10, at least a side of one transparent layer 10 close to the other transparent layer 10 is provided with a convex pad 102. An air layer is formed between adjacent two transparent layers 10 though providing the convex pad 102 between adjacent two transparent layers, the air layer is a light adjusting layer 20.

In this embodiment, a distance between adjacent two transparent layers 10 is increased though providing the groove 101 on a surface of one transparent layer 10 facing the other transparent layer 10 among adjacent two transparent layers 10, or though providing grooves 101 on both of opposite surfaces of adjacent two transparent layers 10, or providing convex pads 102 between adjacent two transparent layers 10, or other manners. At the same time, an air layer or a vacuum layer is formed between adjacent two transparent layers 10, and the air layer or the vacuum layer between adjacent two transparent layers 10 acts as a special light modulation layer 20, that is, a distance between adjacent two transparent layers 10 is the same as the thickness of the light modulation layer 20. According to the mutual interference condition of the preset-wavelength light between adjacent two transparent layers, as provided in the above embodiments, the optical path difference of the preset-wavelength light incident between adjacent two transparent layers 10 may be increased though adjusting the distance between adjacent two transparent layers 10, and when the product of the refractive index of the air layer or the vacuum layer and the distance between adjacent two transparent layers 10 is greater than one half of the preset wave train length, the formation condition of Newton's ring between adjacent two transparent layers 10 may be destroyed, and thus the Newton's ring phenomenon is eliminated.

Figure 11:
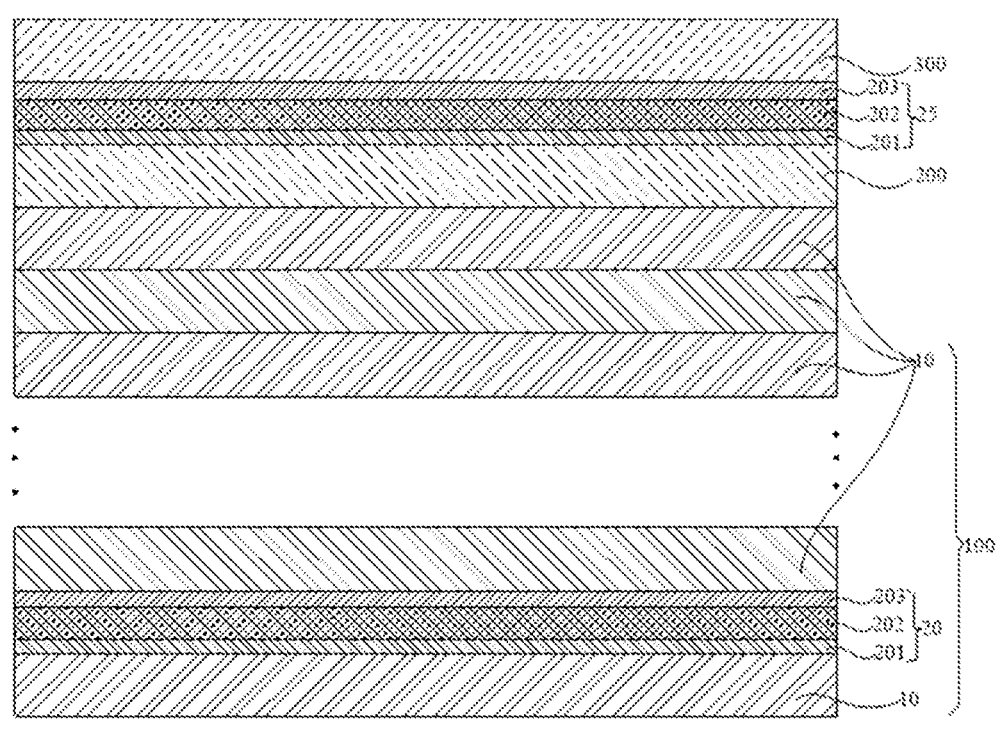
FIG. 11 is a schematic structural diagram of a display panel in which two sides of a light adjusting layer are respectively attached to a light-emitting layer and a encapsulation layer according to yet another embodiment of the present application.

Some embodiments of the present application further provides a display panel, which includes the array substrate 100 provided in the above embodiments. Some embodiments of the present application further provides a display panel, which includes an array substrate with other structure, such as an array substrate that does not include a light-adjusting layer. The following description is based on the array substrate 100 provided in the above embodiments. As shown in FIG. 11, the display panel includes the array substrate 100, a light-emitting layer 200 disposed on the array substrate 100, and an encapsulation layer 300 disposed on the light-emitting layer 200. A light adjusting layer 20 is arranged between the light-emitting layer 200 and the encapsulation layer 300, and at least one side of the light adjusting layer 20 between the light-emitting layer 200 and the encapsulation layer 300 is attached to the encapsulation layer 300 or the light-emitting layer 200. It should be noted that in some embodiments, the encapsulation layer 200 refers to an encapsulation substrate.

For convenience of description and understanding, in this embodiment, the light adjusting layer 20 arranged between the light-emitting layer 200 and the encapsulation layer 300 is replaced by a fifth light adjusting layer 25.

In this embodiment, the condition of forming Newton's ring between the light-emitting layer 200 and the encapsulation layer 300 may be destroyed though arranging the light adjusting layer 20 between the light-emitting layer 200 and the encapsulation layer 300, and thus the Newton's ring phenomenon between the light-emitting layer 200 and the encapsulation layer 300 is eliminated.

Figure 12:
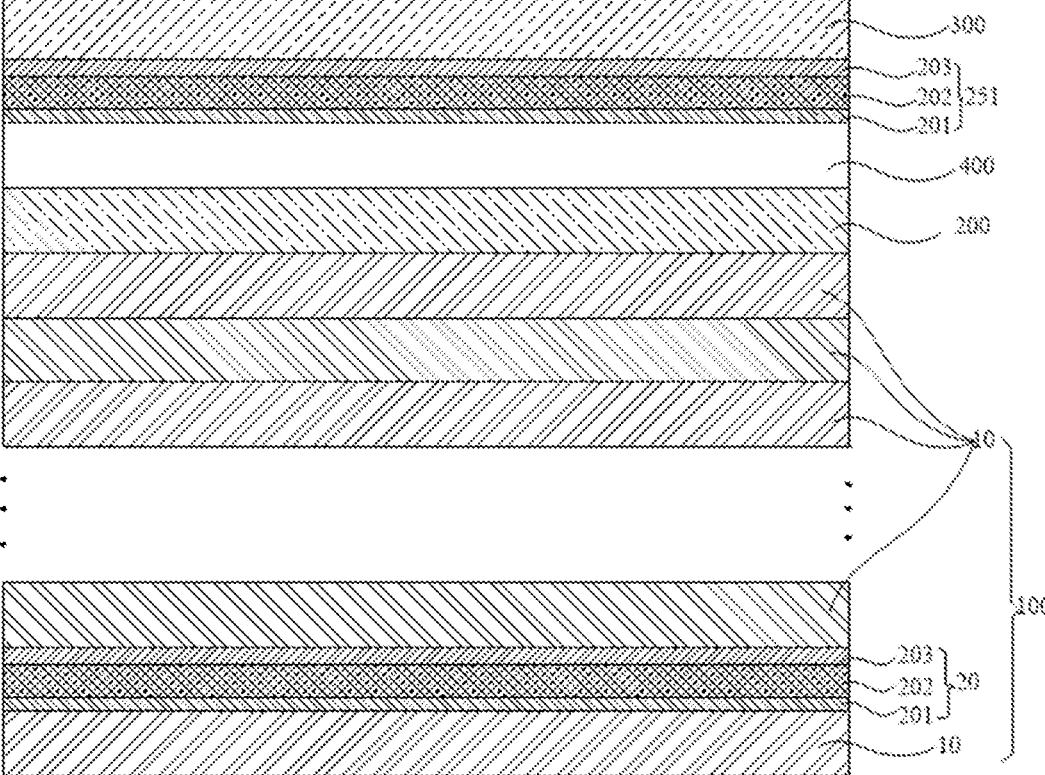
FIG. 12 is a schematic structural diagram of a display panel in which one side of a light adjusting layer is attached to an encapsulation layer according to yet another embodiment of the present application.

In an optional embodiment, referring to FIG. 12, one side of the light adjusting layer 20 located between the light-emitting layer 200 and the encapsulation layer 300 is attached to the encapsulation layer 300, and a vacuum space 400 is formed between the other side of the light adjusting layer 20 and the light-emitting layer 200.

For convenience of description and understanding, in this embodiment, the light adjusting layer 20 between the encapsulation layer 300 and the vacuum space 400 is replaced by a sixth light adjusting layer 251.

Specifically, the sixth light adjusting layer 251 includes a first light modulation layer 201, an optical path adjustment layer 202 and a second light modulation layer 203 stacked in sequence, and two sides of the optical path adjustment layer 202 are respectively attached to the first light modulation layer 201 and the second light modulation layer 203. In this embodiment, the second light modulation layer 203 is attached to the encapsulation layer 300, and a vacuum space 400 is formed between the first light modulation layer 201 and the light-emitting layer 200. The refractive index of the first light modulation layer 201 is between the refractive index of the vacuum space 400 and the refractive index of the optical path adjustment layer 202; the refractive index of the second light modulation layer 203 is between the refractive index of the encapsulation layer 300 and the refractive index of the optical path adjustment layer 202; the product of the refractive index of the optical path adjustment layer 202 and the thickness of the optical path adjustment layer 202 is greater than one half of the preset wave train length. In this embodiment, firstly, the reflectivity of the optical path adjustment layer 202 is reduced by arranging the first light modulation layer 201 and the second light modulation layer 203, and then the formation condition of Newton's ring is destroyed by arranging the optical path adjustment layer 202, and thus the Newton's ring phenomenon between the light-emitting layer 200 and the encapsulation layer 300 is eliminated.

Figures 13, 14:
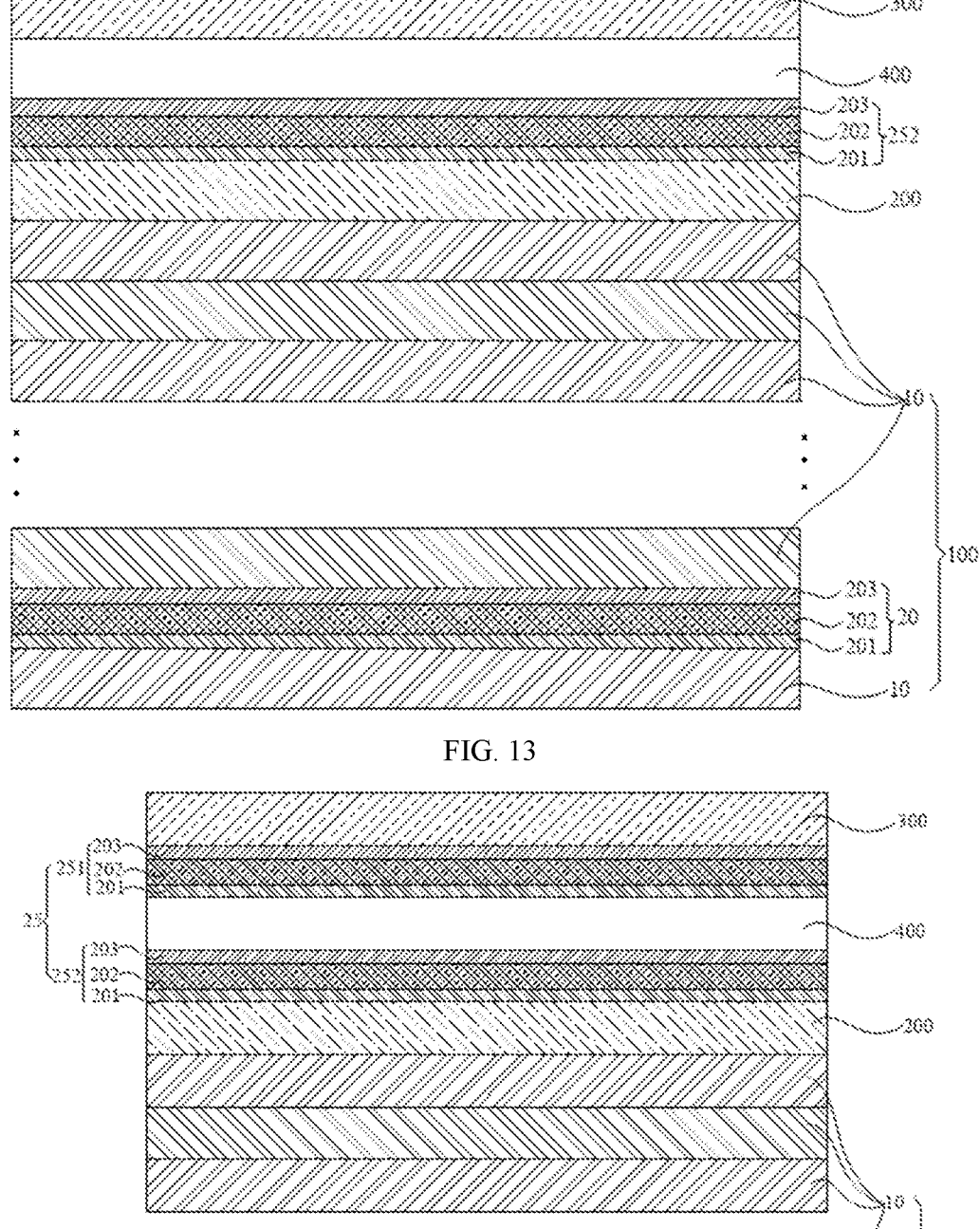
FIG. 13 is a schematic structural diagram of a display panel in which one side of a light adjusting layer is attached to a light-emitting layer according to yet another embodiment of the present application.
FIG. 14 is a schematic structural diagram of a display panel in which two light adjusting layers are arranged between a light-emitting layer and an encapsulation layer, and there is a vacuum space between the two light adjusting layers according to yet another embodiment of the present application.

In another optional embodiment, referring to FIG. 13, one side of the light adjusting layer 20 between the light-emitting layer 200 and the encapsulation layer 300 is attached to the light-emitting layer 200, and the vacuum space 400 is formed between the other side of the light adjusting layer 20 and the encapsulation layer 300.

For convenience of description and understanding, in this embodiment, the light adjusting layer 20 between the light-emitting layer 200 and the vacuum space 400 is replaced by a seventh light adjusting layer 252.

Specifically, the seventh light adjusting layer 252 includes a first light modulation layer 201, an optical path adjustment layer 202, and a second light modulation layer 203 stacked in sequence, and two sides of the optical path adjustment layer 202 are respectively attached to the first light modulation layer 201 and the second light modulation layer 203. In this embodiment, the first light modulation layer 201 is attached to the light-emitting layer 200, and the vacuum space 400 is formed between the second light modulation layer 203 and the encapsulation layer 300. The refractive index of the first light modulation layer 201 is between the refractive index of the light-emitting layer 200 and the refractive index of the optical path adjustment layer 202; the refractive index of the second light modulation layer 203 is between the refractive index of the vacuum space 400 and the refractive index of the optical path adjustment layer 202; the product of the refractive index of the optical path adjusting layer 202 and the thickness of the optical path adjusting layer 202 is greater than one half of the preset wave train length. Therefore, in this embodiment, firstly, the reflectivity of the optical path adjustment layer 202 is reduced by arranging the first light modulation layer 201 and the second light modulation layer 203, and then the formation condition of Newton's ring is destroyed though the optical path adjustment layer 202, and thus the Newton's ring phenomenon between the light-emitting layer 200 and the encapsulation layer 300 is eliminated.

In yet another optional embodiment, referring to FIG. 14, two light adjusting layers 25 are arranged between the light-emitting layer 200 and the encapsulation layer 300, where one side of one light adjusting layer 251 is attached to the encapsulation layer 300, and one side of the other light adjusting layer 252 is attached to the light-emitting layer 200; and the vacuum space 400 is formed between the two light adjusting layers 251, 252.

It can be understood that, the sixth light-adjusting layer 251 and the seventh light-adjusting layer 252 provided in the above embodiments are arranged between the light-emitting layer 200 and the encapsulation layer 300, and the formation condition of Newton's ring between the light-emitting layer 200 and the encapsulation layer 300 is destroyed though the sixth light adjusting layer 251 and the seventh light adjusting layer 252, and thus the Newton's ring phenomenon is eliminated.

Figure 15:
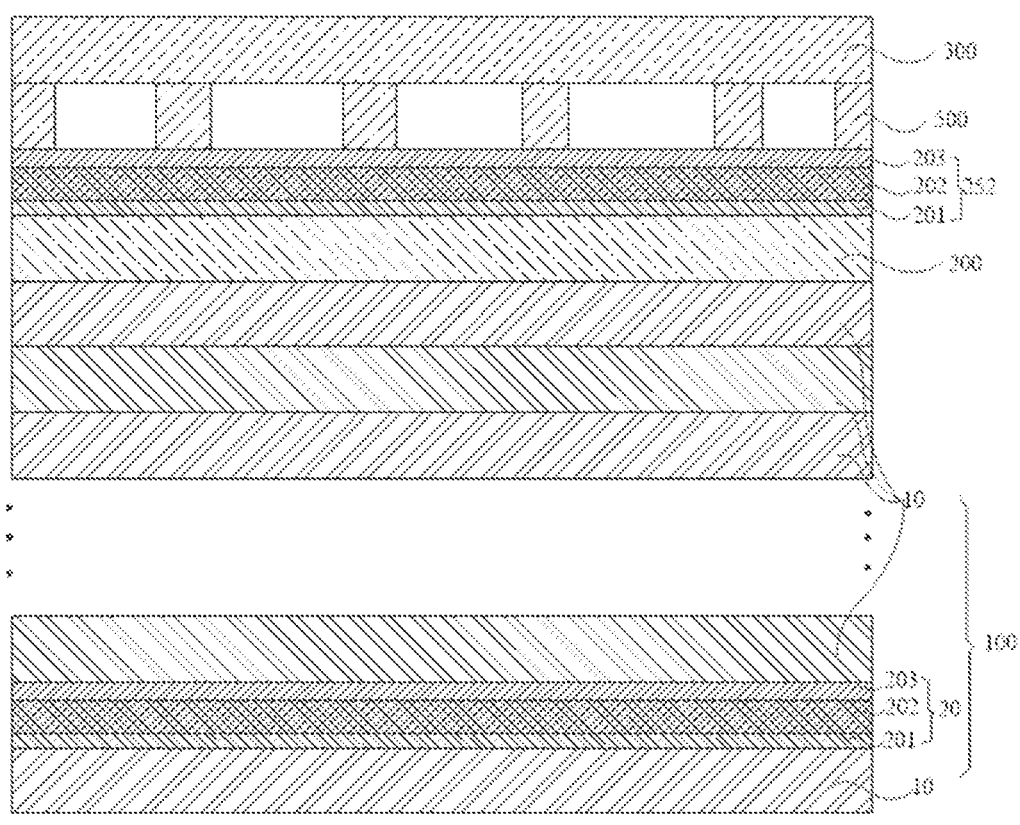
FIG. 15 is a schematic structural diagram of a display panel in which one side of a light adjusting layer is attached to a light-emitting layer, and a support pad is arranged between the other side of the light adjusting layer and an encapsulation layer according to yet another embodiment of the present application.
Figure 16:
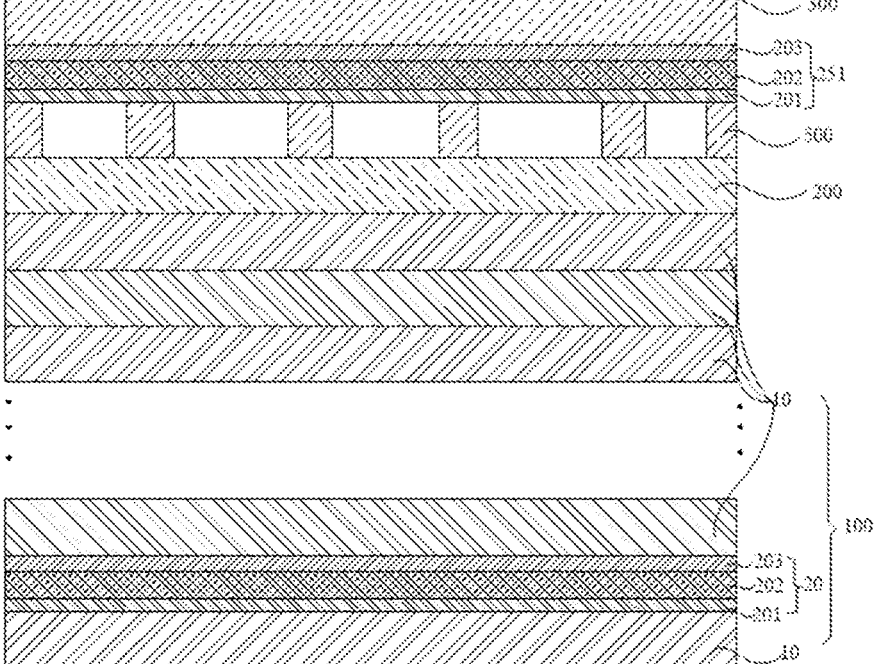
FIG. 16 is a schematic structural diagram of a display panel in which one side of a light adjusting layer is attached to an encapsulation layer, and a support pad is arranged between the other side of the light adjusting layer and a light-emitting layer according to yet another embodiment of the present application.
Figure 17:
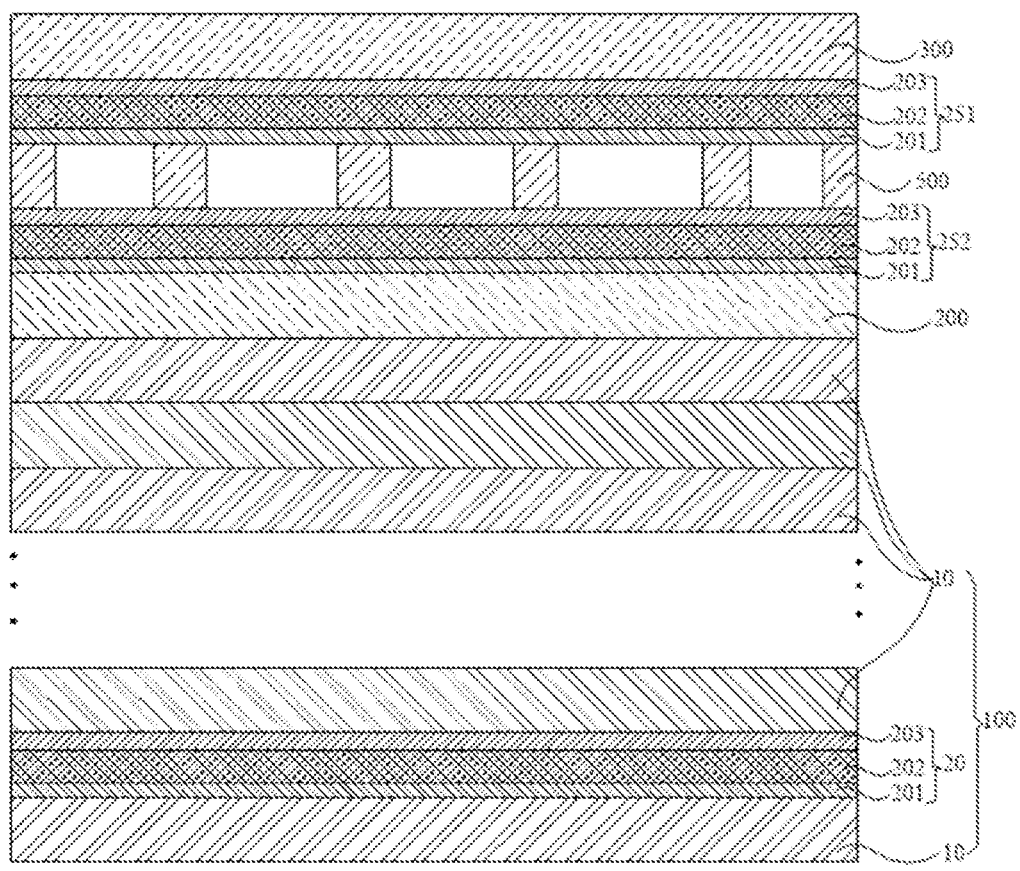
FIG. 17 is a schematic structural diagram of a display panel in which two light adjusting layers are arranged between an encapsulation layer and a light-emitting layer, and a support pad is arranged between the two light adjusting layers according to yet another embodiment of the present application.

On the basis of the above embodiments, in order to prevent the light-emitting layer 200 and the encapsulation layer 300 from collapsing towards the vacuum space 400 over a large area under atmospheric pressure, a plurality of support pads 500 are generally arranged in the vacuum space 400. In this embodiment, as shown in FIG. 16, one end of each of the support pads 500 supports the light adjustment layer 251 attached to the encapsulation layer 300, and the other end of each of the support pads 500 supports the light-emitting layer 200; or, as shown in FIG. 15, one end of each of the support pads 500 supports the encapsulation layer 300, and the other end supports the light adjusting layer 252 attached to the light-emitting layer 200; or, as shown in FIG. 17, one end of each of the support pads 500 supports the light adjusting layer 251 attached to the encapsulation layer 300, and the other end supports the light adjusting layer 252 attached to the light-emitting layer 200. In this embodiment, by arranging the support pads 500 and the light adjusting layer 25, the formation condition of Newton's ring between the light-emitting layer 200 and the encapsulation layer 300 is destroyed, and thus the Newton's ring phenomenon between the light-emitting layer 200 and the encapsulation layer 300 is eliminated.

Figure 18:
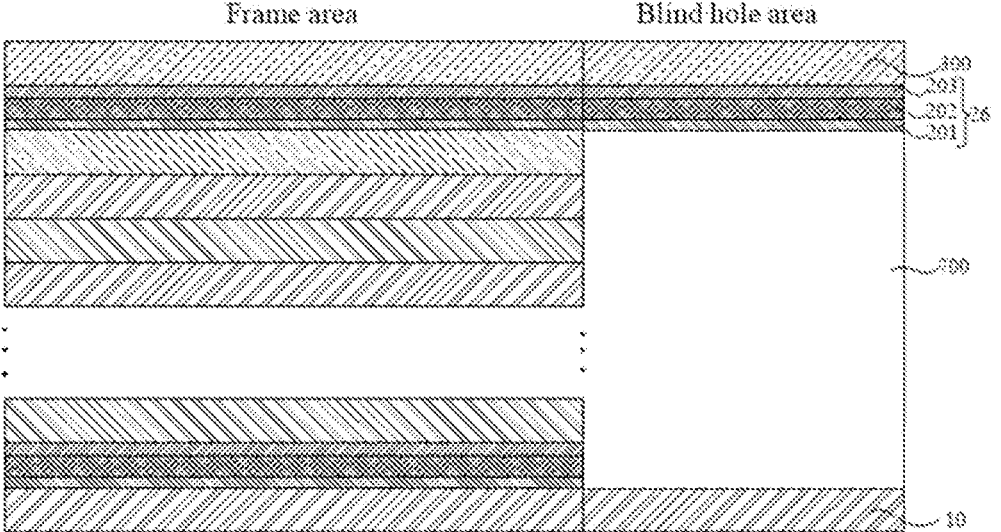
FIG. 18 is a structural schematic diagram of a display panel provided with a mounting hole according to yet another embodiment of the present application.

Optionally, as shown in FIG. 18, an edge of the display panel is provided with a mounting hole 700, and a camera is mounted at a position corresponding to the mounting hole 700, the camera may be mounted under the display panel at a position overlapping with the mounting hole 700 in a top view; the encapsulation layer 300 covers the mounting hole 700, the mounting hole 700 further includes a light adjusting layer 20 between the camera and the encapsulation layer 300, and the light adjusting layer 20 in the mounting hole 700 is attached to the encapsulation layer 300.

For convenience of understanding and description, in this embodiment, the light adjusting layer 20 between the camera and the encapsulation layer 300 is replaced by an eighth light adjusting layer 26.

In order to avoid the occurrence of Newton's ring phenomenon due to the collapse of the encapsulation layer 300 to the mounting hole 700 under an atmospheric pressure which results in the decrease of the optical path difference between the collapsed area of the encapsulation layer 300 and the camera, in this embodiment, the eighth light adjusting layer 26 is arranged between the camera and the encapsulation layer 300, and the product of the refractive index of the eighth light adjusting layer 26 and the thickness of the eighth light adjusting layer 26 is greater than one half of the preset wave train length. In this way, the eighth light adjusting layer 26 destroys the condition of forming Newton's ring between the camera and the encapsulation layer 300, and thus the Newton's ring phenomenon between the camera and the encapsulation layer 300 is eliminated.

The structure of the eighth light adjusting layer 26 is the same as that of the light adjusting layer 20 provided in the above embodiments.

Exemplarily, if the distance between the camera and the encapsulation layer 300 is represented by d, and the refractive index of air or vacuum is 1, the optical path difference of a preset-wavelength light between the camera and the encapsulation layer 300 is 2d. When the eighth light adjusting layer 26 is arranged in the mounting hole 700 and the eighth light adjusting layer 26 has a thickness of $T_s$ and a refractive index of $n_s$, the optical path difference between the camera and the encapsulation layer 300 is changed from 2d to $2d+(n_s-1)*T_s$, increasing the optical path difference. Therefore, the reflection time of the preset-wavelength light at the camera may be delayed, which avoids the mutual interference between the reflected light of the preset-wavelength light on the encapsulation layer 300 and the reflected light of the preset-wavelength light at the camera, and thus eliminates the Newton's ring phenomenon.

Figure 19:
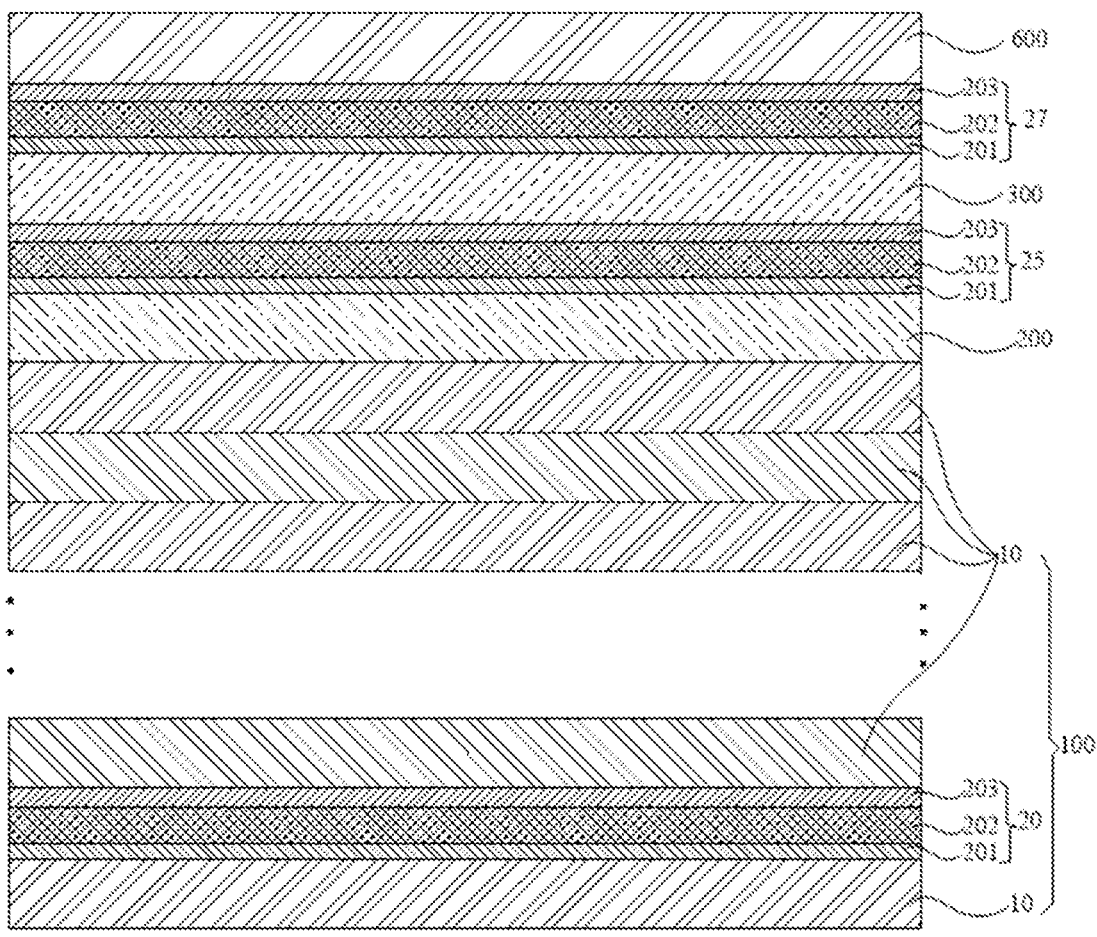
FIG. 19 is a schematic structural diagram of a display panel in which a light adjusting layer is arranged between an encapsulation layer and a touch layer according to yet another embodiment of the present application.

Optionally, as shown in FIG. 19, the display panel further includes a touch layer 600 arranged on the encapsulation layer 300, and a light adjusting layer 20 is arranged between the touch layer 600 and the encapsulation layer 300, and two sides of the light adjusting layer 20 located between the touch layer 600 and the encapsulation layer 300 are respectively attached to the touch layer 600 and the encapsulation layer 300.

For convenience of understanding and description, in this embodiment, the light adjusting layer 20 located between the touch layer 600 and the encapsulation layer 300 is replaced by a ninth light adjusting layer 27.

Specifically, the touch layer 600 is also configured as a transparent layer 10, and a ninth light adjusting layer 27 is arranged between the touch layer 600 and the encapsulation layer 300, the ninth light adjusting layer 27 includes a first light modulating layer 201, an optical path adjusting layer 202 and a second light modulating layer 203 stacked in sequence, and two sides of the optical path adjusting layer 202 are respectively attached to the first light modulating layer 201 and the second light modulating layer 203, the first light modulation layer 201 is attached to the encapsulation layer 300, the second light modulation layer 203 is attached to the touch layer 600, and the refractive index of the first light modulation layer 201 is between the refractive index of the encapsulation layer 300 and the refractive index of the optical path adjustment layer 202, and the refractive index of the second light modulation layer 203 is between the refractive index of the touch layer 600 and the refractive index of the optical path adjustment layer 202, and the product of the refractive index of the optical path adjusting layer 202 and the thickness of the optical path adjusting layer 202 is greater than one half of the preset wave train length. The optical path adjusting layer 202 destroys the condition of forming Newton's ring between the touch layer 600 and the encapsulation layer 300, and thus the Newton's ring phenomenon between the touch layer 600 and the encapsulation layer 300 is eliminated.

The display device provided in this embodiment includes the array substrate provided in the above embodiments or the display panel provided in the above embodiments.

The structures and operating principles of the array substrate and the display panel have been described in detail in the above embodiments, and they will not be described here.

The display apparatus provided by the embodiments of the present application includes an array substrate or a display panel. A light adjusting layer is arranged between at least two adjacent transparent layers, and the product of the refractive index of the light adjusting layer and the thickness of the light adjusting layer is greater than one half of the preset wave train length. In this way, the optical path difference of a preset-wavelength light between adjacent two transparent layers is increased, and the formation condition of Newton's ring is destroyed, so that the Newton's ring phenomenon is eliminated and the display effect of the display panel is improved.

Another embodiment of the present application provides a display panel, including: an array substrate, a light-emitting layer disposed on the array substrate, and an encapsulation layer disposed on the light-emitting layer, where the light adjusting layer is arranged between the light-emitting layer and the encapsulation layer, and at least one side of the light adjusting layer located between the light-emitting layer and the encapsulation layer is attached to the encapsulation layer or the light-emitting layer.

In the description of this specification, the description of reference terms, such as "an embodiment", "some embodiments", "exemplary embodiment", "example", "concrete example" or "some examples" means that the specific features, structures, materials or characteristics described in connection with the embodiments or examples are included in at least one embodiment or example of the present application. In this specification, the schematic expressions of the above terms do not necessarily refer to the same embodiment or example. Furthermore, the specific features, structures, materials or characteristics described may be combined in any one or more embodiments or examples in a suitable manner.

Finally, it should be noted that the above embodiments are only used to illustrate the technical solution of the present application, but not to limit it; although the present application has been described in detail with reference to the foregoing embodiments, those of ordinary skill in the art should understand that it is still possible to modify the technical solutions described in the foregoing embodiments or to equivalently replace some or all of the technical features therein; these modifications or replacements do not make the essence of the corresponding technical solution deviate from the scope of the technical solutions of the embodiments of the present application.

What is claimed is:

1. An array substrate, comprising: at least two transparent layers stacked in sequence, wherein in the at least two transparent layers, a light adjusting layer is arranged between at least adjacent two of the transparent layers, wherein a product of a refractive index of the light adjusting layer and a thickness of the light adjusting layer is greater than one half of a preset wave train length to avoid forming Newton's ring, the preset wave train length refers to a wave train length of a preset-wavelength light incident into the array substrate;

wherein the light adjusting layer comprises a first light modulation layer, an optical path adjustment layer and a second light modulation layer stacked in sequence, two sides of the optical path adjustment layer are respectively attached to the first light modulation layer and the second light modulation layer;

a refractive index of the first light modulation layer is between a refractive index of a transparent layer adjacent to the first light modulation layer and a refractive index of the optical path adjustment layer; a refractive index of the second light modulation layer is between a refractive index of a transparent layer adjacent to the second light modulation layer and the refractive index of the optical path adjustment layer; and a product of the refractive index of the optical path adjustment layer and a thickness of the optical path adjustment layer is greater than one half of the preset wave train length;

wherein the array substrate comprises a substrate and a buffer layer, and the buffer layer comprises a first buffer layer close to the substrate and a second buffer layer parallel to and opposite to the first buffer layer; and the light adjusting layer is arranged between the first buffer layer and the second buffer layer, and both sides of the light adjusting layer located between the first buffer layer and the second buffer layer are respectively attached to the first buffer layer and the second buffer layer.

2. The array substrate according to claim 1, wherein each of the substrate and the buffer layer comprises one of the at least two transparent layers; and the light adjusting layer is arranged between the substrate and the buffer layer, and both sides of the light adjusting layer located between the substrate and the buffer layer are respectively attached to the substrate and the buffer layer.

3. The array substrate according to claim 1, wherein the optical path adjustment layer comprises a titanium dioxide layer or a zinc oxide layer.

4. A display panel, comprising: the array substrate according to claim 1, a light-emitting layer disposed on the array substrate, and an encapsulation layer disposed on the light-emitting layer;

wherein the light adjusting layer is arranged between the light-emitting layer and the encapsulation layer, and at least one side of the light adjusting layer located between the light-emitting layer and the encapsulation layer is attached to the encapsulation layer or the light-emitting layer.

5. The display panel according to claim 4, wherein one side of the light adjusting layer located between the light-emitting layer and the encapsulation layer is attached to the encapsulation layer, and a vacuum space is formed between the other side of the light adjusting layer and the light-emitting layer.

6. The display panel according to claim 5, wherein a plurality of support pads are arranged in the vacuum space, one end of each of the support pads support the light adjusting layer attached to the encapsulation layer, and the other end of each of the support pads supports the light-emitting layer.

7. The display panel according to claim 4, wherein one side of the light adjusting layer located between the light-emitting layer and the encapsulation layer is attached to the light-emitting layer, and a vacuum space is formed between the other side of the light adjusting layer and the encapsulation layer.

8. The display panel according to claim 7, wherein a plurality of support pads are arranged in the vacuum space, one end of each of the support pads supports the encapsulation layer, and the other end of each of the support pads supports the light adjusting layer attached to the light-emitting layer.

9. The display panel according to claim 4, wherein two light adjusting layers are arranged between the light-emitting layer and the encapsulation layer, wherein a side of one light adjusting layer is attached to the encapsulation layer, and a side of the other light adjusting layer is attached to the light-emitting layer; and a vacuum space is formed between the two light adjusting layers.

10. The display panel according to claim 9, wherein a plurality of support pads are arranged in the vacuum space, one end of each of the support pads supports the light adjusting layer attached to the encapsulation layer, and the other end of each of the support pads supports the other light adjusting layer attached to the light-emitting layer.

11. The display panel according to claim 4, further comprising: a touch layer arranged on the encapsulation layer, wherein the light adjusting layer is arranged between the touch layer and the encapsulation layer, and two sides of the light adjusting layer located between the touch layer and the encapsulation layer are respectively attached to the touch layer and the encapsulation layer.

* * * * *